US009036091B2

(12) United States Patent
Hendrickson et al.

(10) Patent No.: US 9,036,091 B2
(45) Date of Patent: May 19, 2015

(54) RECEIVER AND METHOD OF RECEIVING ANALOG AND DIGITAL TELEVISION SIGNALS

(75) Inventors: Alan F. Hendrickson, Rollingwood, TX (US); Alessandro Piovaccari, Austin, TX (US); Ramin Khoini-Poorfard, Austin, TX (US); Mitchell Reid, Austin, TX (US); Frederick Alan Rush, Austin, TX (US); Jean-Marc Guyot, Austin, TX (US); David Le Goff, Tinteniac (FR); Michael Robert May, Austin, TX (US); Henry William Singor, Austin, TX (US); Qi Cai, Austin, TX (US); Peter Jozef Vancorenland, Austin, TX (US); Chunyu Xin, Austin, TX (US); Pascal Blouin, Domloup (FR)

(73) Assignee: Silicon Laboratories Inc., Austin, TX (US)

( * ) Notice: Subject to any disclaimer, the term of this patent is extended or adjusted under 35 U.S.C. 154(b) by 455 days.

(21) Appl. No.: 12/986,053

(22) Filed: Jan. 6, 2011

(65) Prior Publication Data

US 2012/0176550 A1      Jul. 12, 2012

(51) Int. Cl.
*H04N 5/44*      (2011.01)
*H04N 5/50*      (2006.01)
*H04N 21/426*      (2011.01)
(Continued)

(52) U.S. Cl.
CPC ........... *H04N 21/42638* (2013.01); *H04N 5/46* (2013.01); *H03J 1/0008* (2013.01)

(58) Field of Classification Search
None
See application file for complete search history.

(56) References Cited

U.S. PATENT DOCUMENTS 6,208,190 B1 * 3/2001 Lukoff .......................... 327/307
6,252,634 B1 * 6/2001 Yuen et al. .................... 348/731
(Continued)

FOREIGN PATENT DOCUMENTS

CN     1969545 A     5/2007
CN   101621639 A     1/2010
(Continued)

OTHER PUBLICATIONS

Mustafa Badaroglu et al., "Digital Ground Bounce Reduction by Phase Modulation of the Clock", Jul. 14, 2004, Proceedings—Design Automation and Test in Europe Conference and Exhibition, Date 04, pp. 88-93.*

(Continued)

*Primary Examiner* — Nathan Flynn
*Assistant Examiner* — William J Kim
(74) *Attorney, Agent, or Firm* — Cesari & Reed LLP; R. Michael Reed

(57) ABSTRACT

An integrated circuit includes a tuner, a digital television (DTV) demodulator, an analog television (ATV) demodulator, and a controller. The tuner includes an input for receiving a radio frequency (RF) signal including at least one of an analog television signal and digital television signal, and including a first output terminal and a second output terminal. The DTV demodulator includes a DTV input coupled to the first output terminal of the tuner and includes a DTV output terminal. The ATV demodulator includes an ATV input coupled to the second output terminal of the tuner and includes an ATV output terminal. The controller is coupled to the tuner, the DTV demodulator, and the ATV demodulator to configure the tuner and at least one of the DTV demodulator and the ATV demodulator for receiving television content in a selected television format.

24 Claims, 4 Drawing Sheets

(51) Int. Cl.
*H04N 5/46* (2006.01)
*H03J 1/00* (2006.01)

(56) References Cited

U.S. PATENT DOCUMENTS

| | | | |
|---|---|---|---|
| 7,414,676 B2 | 8/2008 | Lindstrom et al. | |
| 8,724,034 B2 | 5/2014 | Chang et al. | |
| 8,902,365 B2 | 12/2014 | Greggain et al. | |
| 2004/0004674 A1* | 1/2004 | Birleson | 348/731 |
| 2004/0008286 A1* | 1/2004 | Markman et al. | 348/725 |
| 2004/0021798 A1 | 2/2004 | Lindstrom et al. | |
| 2005/0028220 A1* | 2/2005 | Baer et al. | 725/131 |
| 2006/0001779 A1* | 1/2006 | Favrat et al. | 348/725 |
| 2008/0225174 A1 | 9/2008 | Greggain et al. | |
| 2008/0284852 A1* | 11/2008 | Yamasaki et al. | 348/181 |
| 2009/0096935 A1 | 4/2009 | Lindstrom et al. | |
| 2009/0262877 A1* | 10/2009 | Shi et al. | 375/376 |
| 2010/0002144 A1* | 1/2010 | Choi | 348/572 |

FOREIGN PATENT DOCUMENTS

| | | |
|---|---|---|
| EP | 1501284 A3 | 2/2012 |
| WO | 2005081519 A1 | 9/2005 |
| WO | 2008110003 A1 | 9/2008 |
| WO | 2009018766 A1 | 2/2009 |

OTHER PUBLICATIONS

Calvo, Carlos. "The differential-signal advantage for communications system design" EE Times Feb. 1, 2010 <retrieved on Jun. 18, 2013> Retrieved from Internet <http://www.eetimes.com/General/PrintView/4019090>, p. 3.*

Silicon Laboratories, Inc.; Worldwide Hybrid TV Tuner with Analog Demodulator; Product Guide; May 26, 2009; 2 Pages; Si2170/1/2; Silicon Laboratories, Inc., Austin, TX, U.S.A.

Silicon Laboratories, Inc.; DVB-T Demodulator; Product Guide; Jun. 18, 2009; 2 Pages; Si2161; Silicon Laboratories, Inc., Austin, TX, U.S.A.

Silicon Laboratories, Inc.; Multi-Standard DVB-T and DVB-C Demodulator; Product Guide; Aug. 24, 2009; 2 Pages; Si2165; Silicon Laboratories, Inc., Austin, TX, U.S.A.

Silicon Laboratories, Inc.; Combo DVB-T/C/S/S2 Digital TV Demodulator; Product Guide; Jun. 8, 2010; 2 Pages; Si2167; Silicon Laboratories, Inc., Austin, TX, U.S.A.

Office Action in the Chinese Patent Office for Corresponding application No. 201210012064.4, Jan. 26, 2014, 8 pages.

Office Action, German Patent Application No. 10 2012 200 164.6, Jun. 18, 2014, 10 pages.

* cited by examiner

RECEIVER AND METHOD OF RECEIVING ANALOG AND DIGITAL TELEVISION SIGNALS

FIELD

The present disclosure is generally related to television receivers, and more particularly to television receivers capable of receiving and demodulating analog television signals and digital television signals.

BACKGROUND

Analog television (TV) receivers often down-convert analog TV transmissions from a first radio frequency (RF) to an intermediate frequency (IF) signal in a component known as a tuner. The IF signal passes through two highly selective filters, one for video IF (VIF) and another for sound IF (SIF), typically constructed using surface acoustic wave (SAW) technology. The tuner provides the resulting video IF (VIF) signal to a video demodulator to recover the baseband video (composite video blanking and synchronization or CVBS) and its carrier. The carrier is typically recovered and applied to the sound IF (SIF) signal to further frequency-translate the SIF signal to a second IF frequency known as an inter-carrier SIF, a second ($2^{nd}$) SIF or SSIF. A sound channel demodulator can then be applied to the SSIF signal to recover baseband audio signals. The tuner, being sensitive to radio frequency (RF) interference, is typically contained in a metalized can, which is designed to shield the tuner from RF interference, including interference generated by switching noise and other spurious RF interference. The analog TV demodulator and sound demodulator may or may not be co-located within the metalized can and may or may not be integrated with the tuner, depending on cost, performance, and system architecture considerations.

In conventional digital TV reception, a similar implementation exists. A tuner, the performance parameters of which are optimized differently for digital TV (DTV) transmissions than for analog TV (ATV), down-converts the DTV signals from an RF signal to an IF signal for filtering through a SAW filter with performance characteristics different than those required for ATV. The resulting IF signal is presented to a DTV demodulator, which decodes the IF signal to produce a digital output known as a Moving Picture Experts Group (MPEG) transport stream (TS). The tuner is typically enclosed in a metalized can to suppress RF interference, and the digital demodulator is typically placed outside of the metalized can due to the potential for the digital demodulator to contribute significantly to RF interference.

SUMMARY

In an embodiment, an integrated circuit includes a tuner, a digital television (DTV) demodulator, an analog television (ATV) demodulator, and a controller. The tuner includes an input for receiving a radio frequency (RF) signal including at least one of an analog television signal and digital television signal, and including a first output terminal and a second output terminal. The DTV demodulator includes a DTV input coupled to the first output terminal of the tuner and includes a DTV output terminal. The ATV demodulator includes an ATV input coupled to the second output terminal of the tuner and includes an ATV output terminal. The controller is coupled to the tuner, the DTV demodulator, and the ATV demodulator and adapted to configure the tuner and at least one of the DTV demodulator and the ATV demodulator for receiving television content in a selected television format.

In another embodiment, a receiver includes a digital television (DTV) demodulator having a DTV input and a DTV output. The DTV demodulator decodes a signal to produce a digital television output signal. The receiver further includes an analog television (ATV) demodulator having an ATV input and an ATV output. The ATV demodulator demodulates the signal to produce an analog television output signal in one of a digital format and an analog format. The receiver also includes a tuner having a tuner input for receiving a radio frequency (RF) signal, which includes at least one of an analog television signal and a digital television signal. The tuner includes a first output terminal and a second output terminal and is adapted to convert the RF signal to a signal having an intermediate frequency. The receiver further includes a controller configured to control operation of the tuner, the DTV demodulator and the ATV demodulator to selectively provide the signal to one of the first output connection and the second output connection.

BRIEF DESCRIPTION OF THE DRAWINGS

In the following description, the use of the same reference numerals in different drawings indicates similar or identical items.

DETAILED DESCRIPTION OF ILLUSTRATIVE EMBODIMENTS

Embodiments of an integrated mixed-signal television receiver circuit are described below that are capable of selectively demodulating an analog television signal or a digital television signal. The integrated circuit enables a low-profile, low part-count television receiver circuit, including printed circuit board designs suitable for international transmission standards. In an embodiment, an integrated circuit includes an input for receiving TV signals at an RF frequency and a tuner circuit configured to filter, amplify and down-convert the TV signal from the RF frequency to an intermediate (IF) frequency, which can be provided to an analog demodulator and/or a digital demodulator for extracting the video and audio signals and for providing the demodulated/decoded signals to input/output interfaces. The integrated circuit further includes the analog TV demodulator, the digital TV demodulator, and a micro control unit (MCU), which controls clock signals, output signal timing, automatic gain control (AGC), calibration, and various other operations to limit spurious RF interference. An example of an integrated circuit that provides both analog TV receiver and digital TV receiver functionality is described below with respect to FIG. 1.

Figure 1:
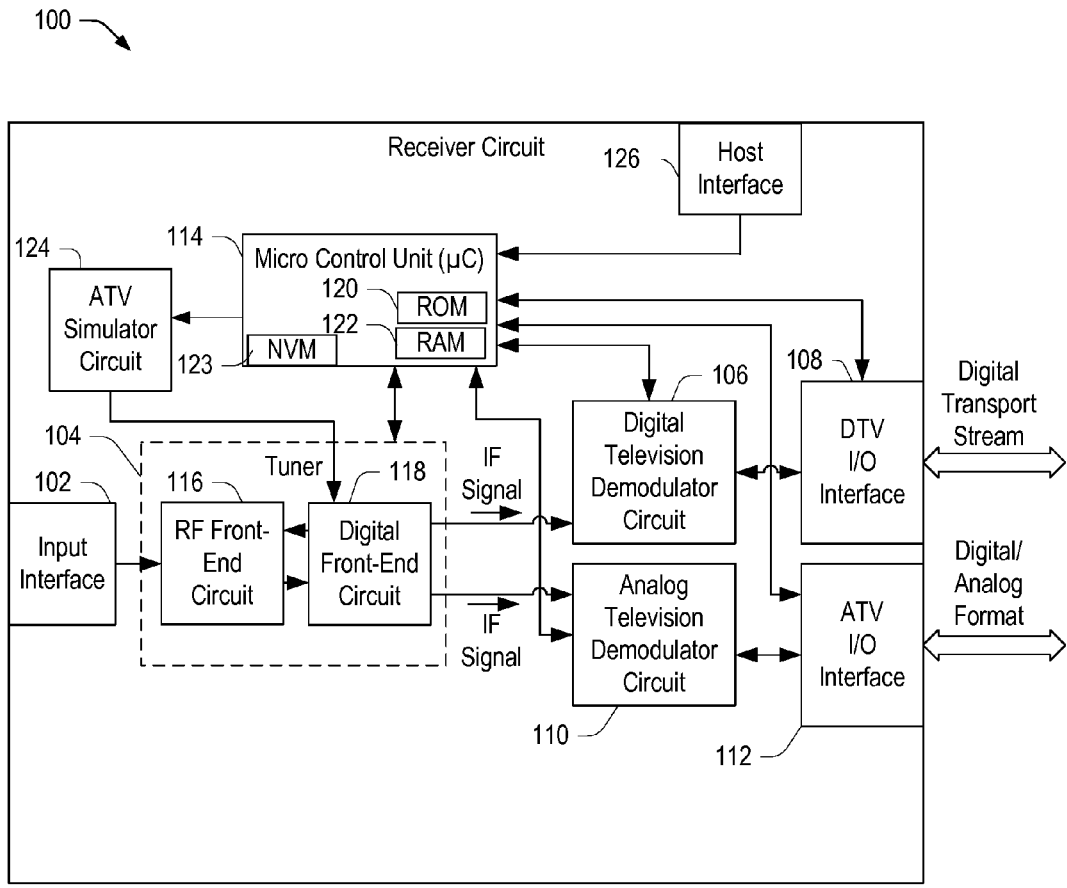
FIG. 1 is a block diagram of an integrated circuit including a tuner, a micro control unit (MCU), a digital television demodulator, and an analog television demodulator.

FIG. 1 is a block diagram of an integrated circuit 100 including a tuner 104, a micro control unit 114, a digital television (DTV) demodulator 106, and an analog television (ATV) demodulator 110. Integrated circuit 100 further includes an input interface 102 configured to receive a radio frequency (RF) TV signal. The RF TV signal may include multiple TV channels including audio and video content. In an embodiment, input interface 102 may be coupled to one or more connection interfaces, each of which is configured to connect to a terrestrial antenna as well as a cable (such as a coaxial cable, an Ethernet cable, Audio/Video cables, or any combination thereof) carrying the RF TV signal in a digital format or an analog format. In some instances, the RF TV signal may include both digital and analog TV signals. Input interface 102 includes an output connected to tuner 104.

Tuner 104 includes an RF front-end circuit 116 having an input connected to the output of input interface 102 and an output connected to a digital front-end circuit 118. Digital front-end circuit 118 includes a first output connected to DTV demodulator 106 and a second output connected to ATV demodulator 110. DTV demodulator 106 includes one or more outputs connected to a DTV input/output (I/O) interface 108, which can connect to a digital television system, such as a high-definition DTV system on an MPEG decoding chip. ATV demodulator 110 includes one or more outputs connected to an ATV I/O interface 112, which can connect to an analog television system.

Integrated circuit 100 further includes a micro control unit (MCU) 114, which is shared by tuner 104, DTV demodulator 106, DTV I/O interface 108, ATV demodulator 110, and ATV I/O interface 112. MCU 114 controls the configuration and operation of the various components. Further, MCU 114 includes a host interface 126 for receiving signals from a host system, which may communicate with MCU 114 using an inter-integrated circuit ($I^2C$) bus. MCU 114 includes a read-only memory (ROM) 120, a random access memory 122, and optionally a non-volatile memory (NVM) 123, which are accessible to MCU 114 to store data and instructions. Additionally, MCU 114 controls an on-chip ATV simulator circuit 124 configured to inject a simulated ATV signal into digital front-end circuit 118 to provide a self-test of integrated circuit 100 and self-test capability for the TV device that incorporates integrated circuit 100, possibly reducing overhead test cost. In another embodiment, ATV simulator circuit 124 may be configured to inject the simulated ATV signal into RF front end circuit 116.

In the illustrated example, bi-directional connectors are used to depict logical connections between various components. However, it should be appreciated that such logical connections may include multiple wire traces or physical communication paths, allowing data to be communicated bi-directionally between two components. In a particular example, such data can include television content in one direction and feedback data in the other.

In an example, MCU 114 configures tuner 104, DTV demodulator 106, and ATV demodulator 110, as needed, to achieve desired performance characteristics for both analog and digital TV transmissions. RF front-end circuit 116 receives an RF signal, amplifies, mixes, and filters the RF signal to produce in-phase and quadrature (I and Q) output signals at an intermediate frequency (IF), which are provided to digital front-end circuit 118. Digital front-end circuit 118 applies a gain and performs further filtering. For example, digital front-end circuit 118 may apply a channelization filter function to filter the IF signals. In an embodiment, the channelization filter function is implemented with the combination of an analog-to-digital converter (ADC), a digital filter, and a digital-to-analog converter (DAC) to allow configurability of the filter transfer characteristics depending on the transmission standard being received. Digital front-end circuit 118 provides an IF output signal (including either ATV or DTV content) to demodulator circuitry, including DTV demodulator 106 and ATV demodulator 110, for recovery of baseband DTV signals or ATV signals, respectively. The IF output signal is a digital IF signal, that is a discrete-time numerical representation of DTV or ATV content represented by multiple bits, the spectrum of which is located in some pass band, where the center of that pass band is defined as an IF carrier frequency. ATV demodulator 110 demodulates the IF signal including ATV content to separate baseband video CVBS and either SSIF or baseband sound signals. DTV demodulator 106 demodulates the IF signal including DTV content to produce a Moving Picture Experts Group (MPEG) transport stream.

In an embodiment, integrated circuit 100 integrates multiple television receiver functions including tuner functions, ATV demodulator functions, DTV demodulator functions, and common control functions in a mixed-signal integrated circuit implemented in complementary metal oxide semiconductor (CMOS) technology. Integration of the various functions into a single IC reduces in the number of circuit components and reduces the printed circuit board area relative to a system that combines multiple separate circuit components. Further, integrated circuit 100 provides a receiver that is configurable to conform to a plurality of international transmission standards by providing configurable solid-state signal processing elements. Thus, integrated circuit 100 enables reduced inventory control complexity for manufacturers, because the same integrated circuit structure can be configured for use in conjunction with a variety of receiving standards. Further, the CMOS implementation of integrated circuit 100 provides a low-profile circuit board (i.e., a circuit board with a relatively small thickness) with reduced circuit real estate, which circuit board can readily be incorporated in thin-screen television sets.

Integration of tuner 104 with DTV demodulator 106 and ATV demodulator 110 and with the DTV I/O interface 108 is non-trivial. In particular, tuner 104 is sensitive to interference arising from operation of the DTV and ATV demodulator functions performed by DTV demodulator 106 and ATV demodulator 110, respectively. Periodic impulsive emissions from the digital circuitry (i.e. switching noise) of a mixed-signal integrated circuit (IC) may interfere with RF performance. In particular, switching noise can generate electromagnetic interference, which can introduce RF interference in the receiver circuitry, adding noise to the RF signal, particularly at the switching frequency and its harmonics. Further, RF interference arises from digital I/O activity, for example on the DTV I/O interface 108 (e.g., a digital MPEG transport stream output).

Additionally, integration of tuner 104, DTV demodulator 106, and ATV demodulator 110 presents difficulties with respect to consolidation of performance specifications across multiple transmission standards within a common superset of specifications. Further, such integration presents a need for a controller capable of managing the configurations of tuner 104, DTV demodulator 106, and ATV demodulator 110 to operate in each target operating scenario (i.e., for each transmission standard and for each type of RF signal). MCU 114 operates as a shared controller configurable to manage the components for a selected transmission standard.

Another issue with respect to integration of the tuner 104, DTV demodulator 106, and ATV demodulator 110 on an integrated circuit involves heat dissipation. In particular, integration of RF front-end 116, digital front-end 118, MCU 114, DTV demodulator 106, and ATV demodulator 110 in the relatively small package area, as compared to conventional receivers that separate some or all of such circuits, provides a relatively high density of power dissipation in the small package area. In some instances, sharing of circuit components for both ATV and DTV functions within tuner 104 reduces the overall heat dissipation of integrated circuit 100 relative to conventional hybrid receiver circuits.

Integrated circuit 100 allows sophisticated communication between various operations of tuner 104 and DTV demodulator 106 and between such operations and ATV demodulator 110, for example real-time dynamic optimization of parameters of the tuner 104 from information determined within one of the DTV demodulator 106 and the ATV demodulator 110, depending on the type of signal being received. In contrast, conventional receiver circuitry uses multiple ICs that require communication of such information through a port, typically through a serial port, the bandwidth of which limits both the volume of information communicated and the precise timing of its delivery. Serial port activity contributes spurious RF interference that can further interfere with the operation of tuner 104. Thus, unlike conventional systems where communication is typically restricted to occur only infrequently or during moments when certain performance parameters can be relaxed, integrated circuit 100 can utilize relatively robust communications between DTV and ATV demodulators 106 and 110 and tuner 104 in real-time or near real-time, providing enhanced performance of the tuner 104 and demodulators (DTV demodulator 106 and ATV demodulator 110).

By integrating MCU 114, DTV demodulator 106, ATV demodulator 110, and tuner 104 in an integrated circuit, continuous feedback information, such as adjustable gain control feedback signals from the demodulators to tuner 104, does not require separate serial ports between tuner 104 and DTV demodulator 106 and between tuner 104 and ATV demodulator 110. Thus, integrated circuit 100 provides reduced implementation costs in terms of enabling paths (e.g., the number of pins) for ingress of RF interference along the PCB trace conducting the control signals. Further, inclusion of MCU 114 reduces serial control port activity and reduces the attendant RF interference. MCU 114 receives simple, infrequent instructions from a host system, for example, via a serial port, and MCU 114 can translate such instructions into more complex procedures executing internally for reconfiguration of the various components, including operating parameters and various real-time signal-processing functions, such as channel scanning algorithms, signal-to-noise ratio (SNR) calculations and reporting, error recovery, AGC timing, etc.

In an example, MCU 114 configures tuner 104 and ATV demodulator 110 for analog TV reception. Analog RF television reception is more sensitive to RF interference than, for example, digital RF television reception. Accordingly, MCU 114 disables DTV demodulator 106 and the output transport stream while receiving an analog channel to reduce or eliminate its noise contribution due to digital switching noise. In a particular example, MCU 114 controls DTV demodulator 106 and DTV I/O interface 108 to enter an "idle" mode or state that uses relatively less power or that is disabled altogether while receiving ATV signals. MCU 114 may also manipulate clock signals within DTV demodulator 106 to reduce or eliminate clock-related RF spurs that might introduce RF interference at a frequency of interest. Further, MCU 114 controls operation of ATV demodulator 110 and ATV I/O interface 112 to provide differential output signals for reducing in-band noise.

In another example, MCU 114 configures tuner 104 and DTV demodulator 106 for digital TV reception. In general, digital switching of the output pins of DTV I/O interface 108 can generate spurious interference in the receiver. MCU 114 controls clock rates and switching timing of DTV demodulator 106 and controls the timing of the output of a digital transport stream from DTV I/O interface 108 to reduce or eliminate spurious RF interference at a frequency of interest. MCU 114 provides for an integrated management of DTV demodulator 106 and ATV demodulator 110 to reduce or eliminate RF Interference. In one example, MCU 114 controls timing and waveform shape of digital switching events such that a spectrum of resulting digital switching noise reduces resulting spurious interference in a frequency band of interest. Further, MCU 114 adjusts clock rates to control locations of clock-related spurs to avoid introducing spurious RF interference either directly in the signal band or at frequencies which may, through inter-modulation mechanisms, be indirectly translated into the signal pass band.

Figure 2:
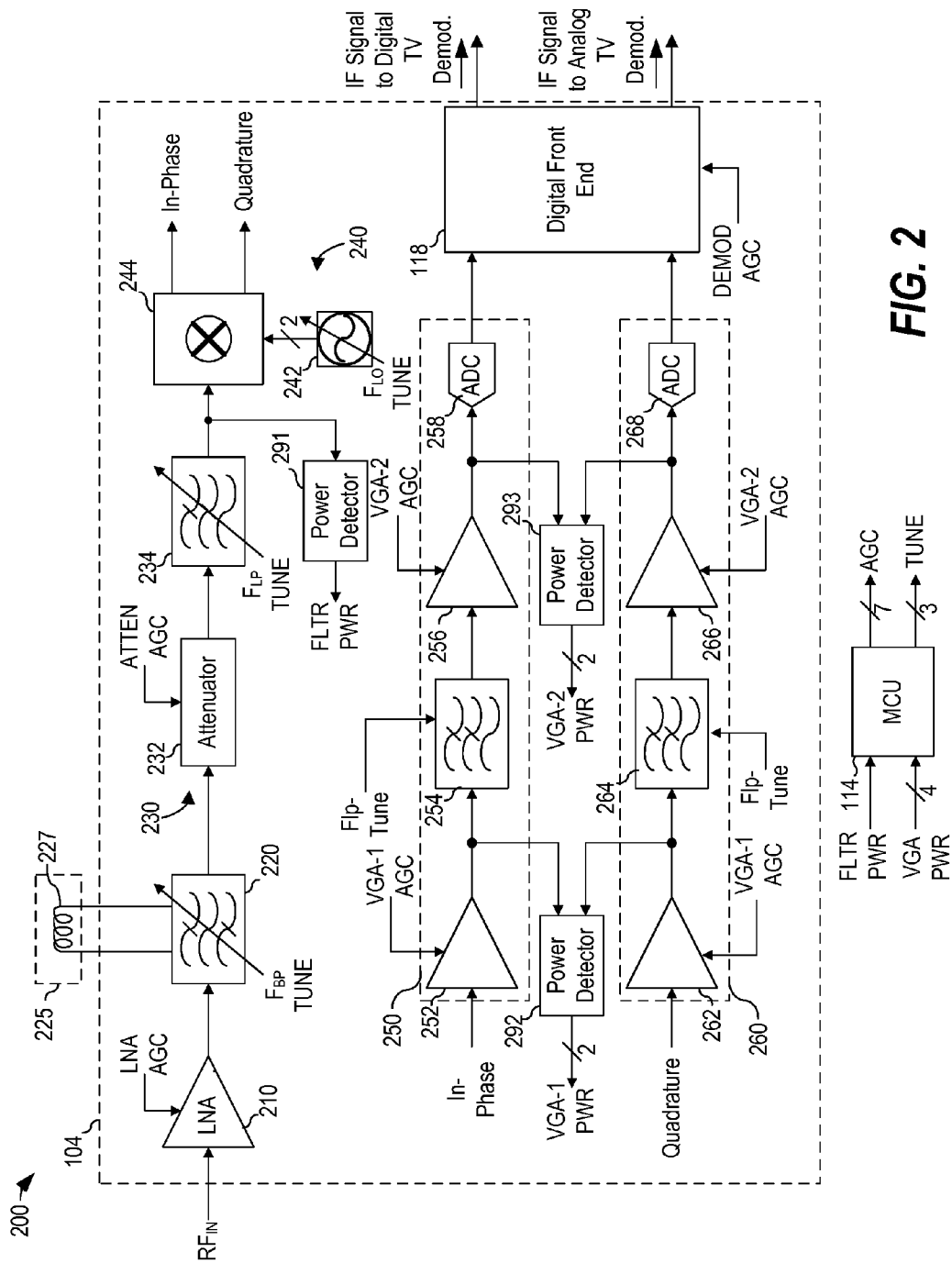
FIG. 2 illustrates, in partial block diagram and partial schematic form, an embodiment of a radio frequency front-end circuit portion of the tuner of FIG. 1 in a television receiver.

FIG. 2 illustrates, in partial block diagram and partial schematic form, an embodiment of tuner 104 and MCU 114 in a television receiver 200. TV receiver 200 includes tuner 104, MCU 114, and an integrated passive device (IPD) 225. IPD 225 can be integrated within integrated circuit 100 of FIG. 1. Alternatively, IPD 225 can be a separate or separately integrated circuit and integrated circuit 100 can include a pair of terminals for connecting to IPD 225. IPD 225 includes a set of inductors of which a representative inductor 227 is illustrated.

Tuner 104 includes generally RF front-end circuit 116, including a low noise amplifier (LNA) 210, a tracking bandpass filter 220, a preconditioning circuit 230, a mixing circuit 240, a first intermediate frequency (IF) processing circuit 250, and a second IF processing circuit 260. Tuner 104 further includes digital front-end circuit 118. Tuner 104 also includes three power detectors 291, 292, and 293. LNA 210 has a first input for receiving an RF input signal labeled "$RF_{IN}$", a second input for receiving an LNA automatic gain control signal labeled "LNA AGC", and an output. Tracking bandpass filter 220 has a first input connected to the output of LNA 210, a second input for receiving a center frequency tuning signal labeled "$F_{BP}$ TUNE", two terminals connected to inductor 227, and an output.

Preconditioning circuit 230 includes an attenuator 232 and a filter 234. Attenuator 232 has a first input connected to the output of tracking bandpass filter 220, a second input for receiving an attenuator automatic gain control signal labeled "ATTEN AGC", and an output. Filter 234 has a first input connected to the output of attenuator 232, a second input for receiving a cutoff frequency tuning signal labeled "$F_{LP}$ TUNE", and an output.

Mixing circuit 240 includes a local oscillator 242 and a mixer 244. Local oscillator 242 has an input for receiving a local oscillator tuning signal labeled "$F_{LO}$ TUNE", and an output for providing two mixing signals, including an in-phase mixing signal and a quadrature mixing signal. Mixer 244 has a first input connected to the output of filter 234, a second input connected to the output of local oscillator 242, a first output for providing an in-phase IF signal, and a second output for providing a quadrature IF signal.

IF circuit 250 includes a variable gain amplifier (VGA) 252, a low-pass filter 254, a VGA 256, and an analog-to-digital converter (ADC) 258. VGA 252 has a first input connected to the first output of mixer 244, a second input for receiving a VGA automatic gain control signal labeled "VGA-1 AGC", and an output. Low-pass filter 254 has an input connected to the output of VGA 252, a second input for receiving a low-pass filter tuning signal labeled "Flp-Tune", and an output. VGA 256 has a first input connected to the output of low-pass filter 254, a second input for receiving a VGA automatic gain control signal labeled "VGA-2 AGC", and an output. ADC 258 has an input connected to the output of VGA 256, and an output.

IF circuit 260 includes a VGA 262, a low-pass filter 264, a VGA 266, and an ADC 268. VGA 262 has a first input connected to the second output of mixer 244, a second input for receiving signal VGA-1 AGC, and an output. Low-pass filter 264 has an input connected to the output of VGA 262, a second input for receiving a low-pass filter tuning signal labeled "Flp-Tune", and an output. VGA 266 has a first input connected to the output of low-pass filter 264, a second input for receiving a signal VGA-2 AGC, and an output. ADC 268 has an input connected to the output of VGA 266, and an output. In another embodiment, additional gain or attenuation elements are present in IF circuits 250 and 260. Such additional elements may also include gain control signals.

Digital front-end circuit 118 has a first input and a second input connected to the outputs of ADCs 258 and 268, respectively. Digital front-end circuit 118 further includes a third input for receiving a gain control signal labeled "DEMOD AGC", a first output for providing the IF signal to DTV demodulator 106, and a second output for providing the IF signal to ATV demodulator 110.

MCU 114 has a first input for receiving filter power signals labeled "FLTR PWR" and a second input for receiving VGA power signals labeled "VGA PWR". MCU 114 further includes a first output providing the frequency tuning signals $F_{BP}$ TUNE, $F_{LP}$ TUNE, and $F_{LO}$ TUNE, and a second output for providing the AGC signals LNA AGC, ATTEN AGC, VGA-1 AGC (×2), VGA-2 AGC (×2), and DEMOD AGC.

Power detector 291 has an input connected to the output of filter 234, and an output connected to the first input of MCU 114 for providing a power level signal for tracking bandpass filter 220, labeled "FLTR PWR". Power detector 292 has first and second inputs connected to the outputs of VGA 252 and VGA 262, respectively, and an output connected to the second input of MCU 114 for providing two signals, including a power level signal for VGA 252 and a power level signal for VGA 262, and labeled collectively as "VGA-1 PWR". Power detector 293 has first and second inputs connected to the outputs of VGA 256 and VGA 266, respectively, and an output connected to the second input of MCU 114 for providing two signals, including a power level signal for VGA 256 and a power level signal for VGA 166, and labeled collectively as "VGA-2 PWR". MCU 114 controls RF front-end circuit 116 of tuner 104 by providing control signals LNA AGC, $F_{BP}$ TUNE, ATTEN AGC, $F_{LP}$ TUNE, $F_{LO}$ TUNE, VGA ADC, VGA-2 AGC, and DEMOD AGC by communicating the control signals directly, without having to communicate via serial connections.

In operation, receiver 200 functions as a television receiver adapted to receive and demodulate television channels. Signal $RF_{IN}$ is a broadband signal that includes energy from several television signals modulated onto carrier waves at different frequencies. The different carrier waves constitute the television channels from which television content can be received. Signal $RF_{IN}$ can be received from an antenna, from a cable television connection, from a satellite connection, or from another broadband signal source. MCU 114 is adapted to control the various elements in receiver 200 according to the channel selected by the user. Receiver 200 uses a dual-filter architecture for the pre-mixing tuner. Signal $RF_{IN}$ is received and amplified as necessary in LNA 210 under the control of MCU 114 via signal LNA AGC.

Tracking bandpass filter 220 is a second-order LC filter that assists in providing image rejection by filtering neighboring channels, a significant part of whose energy could be reflected back into the passband. Tracking bandpass filter 220 is implemented with inductor 227 and an array of switched capacitors, the selection of which functions to tune the center frequency of the passband of tracking bandpass filter 220 under the control of MCU 114 via signal $F_{BP}$ TUNE. Attenuator 232 provides attenuation of the partially filtered $RF_{IN}$ signal from tracking bandpass filter 220 under the control of MCU 114 via signal ATTEN AGC. Filter 234 provides additional attenuation of the third and higher harmonic of the mixing signal under the control of MCU 114 via signal $F_{LP}$ TUNE to prevent unwanted energy from a neighboring channel from being mixed into the passband. Local oscillator 242 uses a digital mixing signal that is a square wave, which has significant energy at its third harmonic and higher.

Mixer 244 is a quadrature mixer that mixes the filtered and attenuated $RF_{IN}$ signal with the signal from local oscillator 242 to produce sum or difference output frequencies:

$$f_1 = f_{CW} + f_{LO} \quad (1)$$

or $$f_2 = f_{CW} - f_{LO} \quad (2)$$

where $f_{CW}$ is the frequency of the carrier of a selected channel, and $f_{LO}$ is the local oscillator frequency. When a desired IF is represented by $f_1$ in Equation 1 above, television receiver 200 is said to be a high-IF receiver. When the desired IF is represented by $f_2$ in Equation 2, television receiver 200 is said to be a low-IF receiver. In an embodiment, the desired IF is selectable in the range of 3 to 5 megahertz (MHz), and thus television receiver 200 implements a low-IF architecture. In a particular example, the desired IF is selectable to 0 MHz, allowing television receiver 100 to operate as a direct down-conversion receiver.

To tune a selected channel to the desired IF, local oscillator 242 is set to a frequency that, when mixed with the selected channel, translates the selected channel to a low IF frequency of 0 MHz or 3-5 MHz, under the control of MCU 114 via signal $F_{LO}$. Local oscillator 242 is configured to provide two outputs to mixer 244: an in-phase local oscillator output, and a quadrature local oscillator output. Mixer 244 provides an in-phase IF signal to IF circuit 250, and a quadrature IF signal to IF circuit 260, for further processing. In other embodiments, receiver 200 may use a high-IF architecture or it may use a direct down-conversion architecture.

Each of IF circuits 250 and 260 perform further signal conditioning on the in-phase and quadrature IF signals from mixer 244. For example, the in-phase IF signal is further conditioned in IF circuit 250, where the in-phase IF signal is amplified by VGA 252 under the control of MCU 114 via signal VGA-1 AGC. Low-pass filter 254 provides attenuation of the desired channel; for example, when operating at an IF of 4 MHz for a signal bandwidth of 6 MHz, low-pass filter 254 provides attenuation above a cutoff frequency of 7 MHz to filter unwanted energy above the channel bandwidth. VGA 256 receives the filtered in-phase IF signal and amplifies or attenuates it to a level that prevents signal clipping in ADC 258. VGA 256 operates under the control of MCU 114 via signal VGA-2 AGC. ADC 258 converts the filtered and level set in-phase IF signal to the digital domain. IF circuit 260 functions similarly to IF circuit 250, except that processing in IF circuit 260 is done on the quadrature IF signal from mixer 244.

Digital front-end circuit 118 receives the in-phase and quadrature digital domain IF signals from ADCs 258 and 268, respectively, and optionally performs various digital signal processing functions, including filtering the in-phase and quadrature signals, and image rejection. Digital front-end 118 includes a first output for providing the in-phase and quadrature IF signals to DTV demodulator 106 and a second output for providing the in-phase and quadrature IF signals to ATV demodulator 110.

In operation, MCU 114 with programmable ROM 120 can configure the operating parameters of the components of tuner 104 according to need, as different standards require different trade-offs, including real-time algorithm execution.

Figure 3:
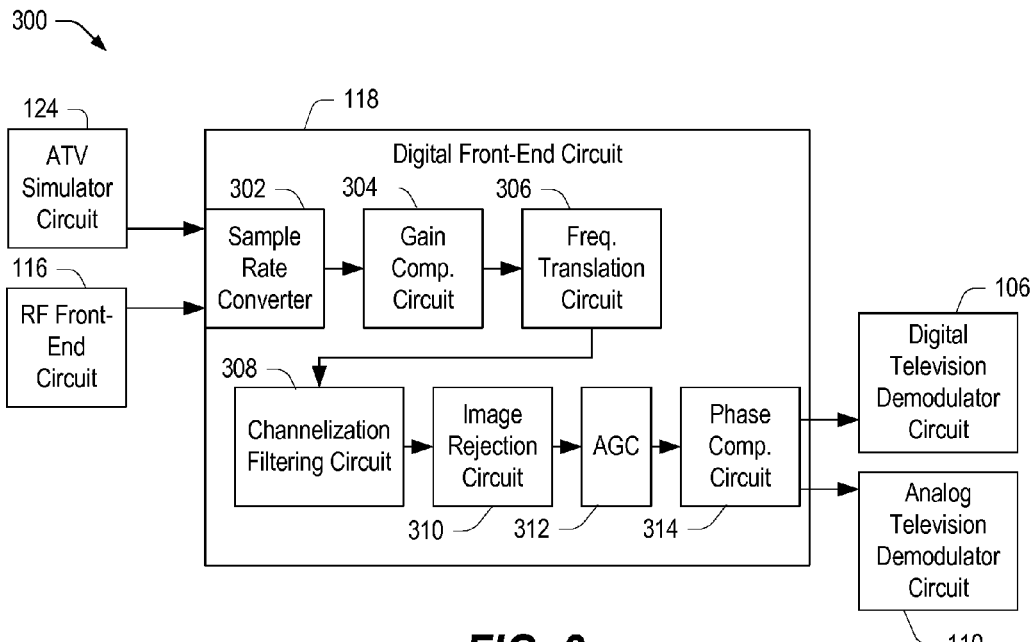
FIG. 3 is a block diagram of an embodiment of a digital front-end circuit of the tuner of FIG. 1.

FIG. 3 is a block diagram 300 of an embodiment of a digital front-end circuit 118 of the tuner 104 of FIG. 1. Digital front-end circuit 118 includes a sample rate converter 302 having an input connected to an output of RF front-end circuit 116 and an output connected to an input of a gain compensation circuit 304. Sample rate converter 302 further includes an input coupled to ATV simulator circuit 124.

Gain compensation circuit 304 includes an output connected to an input of a frequency translation circuit 306, which has an output connected to an input of a channelization filtering circuit 308. Channelization filtering circuit 308 includes an output connected to an input of an image rejection circuit, which has an output connected to an input of an automatic gain control (AGC) circuit 312. AGC 312 includes an output connected to an input of a phase compensation circuit 314, which includes a first output connected to DTV demodulator circuit 106 and a second output connected to ATV demodulator circuit.

In an example, sample rate converter 302 receives a signal from RF front-end circuit 116 and converts the signal from a first sampling rate to a second sampling rate and provides the converted signal to a gain compensation circuit 304. Gain compensation circuit 304 applies a gain to the converted signal to compensate for distortion introduced by processes performed on the signal by RF front-end circuit 116 and by sample rate converter 302. Gain compensation circuit 304 provides the compensated signal to a frequency translation circuit 306, which may be a mixer or some other circuit configured to translate a signal spectrum associated with the compensated signal from a first center frequency to a second center frequency. Frequency translation circuit 306 provides the frequency translated signal to channelization filtering circuit 308, which provides a passband filter function that filters output frequencies other than those in the passband, and provides the filtered signal to an image rejection circuit 310. Image rejection circuit 310 filters image noise from the signal that has leaked into the passband and provides the filtered signal to AGC 312. AGC 312 applies a gain to the filtered signal and supplies the signal to a phase compensation circuit 314. Phase compensation circuit 314 compensates for phase errors introduced by prior circuitry, and provides the corrected signal to DTV demodulator circuit 106 and to ATV demodulator circuit 110.

It should be appreciated that, in the illustrated embodiments, tuner 104 and its components (RF front-end circuit 116 and digital front-end circuit 118) represent logical functional organizations of elements, but that various circuit components may be distributed throughout the integrated circuit. For example, in an alternative embodiment, a portion of the channelization filtering circuit 308 may be included within ATV demodulator circuit 110. In such an instance, ATV demodulator 110 may include an output coupled to an input of DTV demodulator circuit 106.

Figure 4:
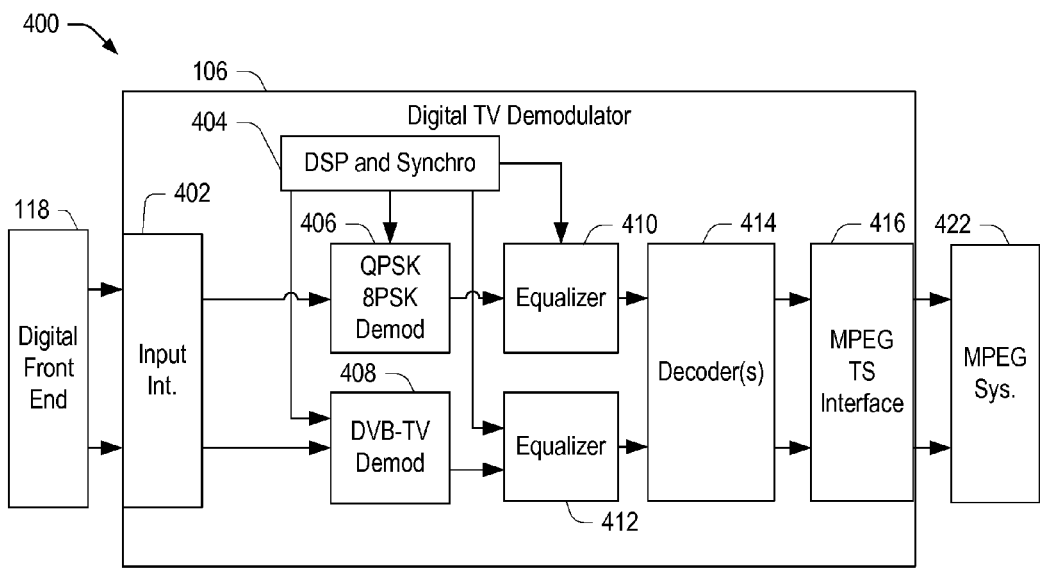
FIG. 4 is a block diagram of an embodiment of the digital television demodulator of FIG. 1.

FIG. 4 is a block diagram of an embodiment of the DTV demodulator 106 of FIG. 1. DTV demodulator 106 includes an input interface 402 for receiving IF signals (in-phase and quadrature) from digital front-end circuit 118. Input interface 402 includes a first output connected to a quadrature phase shift keying (QPSK)/8-PSK demodulator 406 and a second output connected to a digital video broadcasting (DVB)-TV demodulator 408, which both operate under the control of a digital signal processing and synchronization circuit 404. QPSK/8PSK demodulator 406 determines the phase of the received signal and maps it back to the symbol it represents to recover the original DTV content according to the QPSK and/or 8PSK decoding schemes. QPSK/8PSK demodulator 406 can be configured by MCU 114 to implement any number of PSK decoding techniques. DVB-TV demodulator 408 demodulates the received signal according to any number of digital transmission standards, including DVB-Terrestrial (DVB-T), DVB-Cable (DVB-C), DVB-Satellite (DVB-S), DVB-S second generation satellite (DVB-S2) digital transmission standards. In some instances, DVB-TV demodulator 408 may be reconfigured by MCU 114 to demodulate other digital transmission standards.

QPSK/8PSK demodulator 406 and DVB-TV demodulator 408 provide demodulated outputs to equalizers 410 and 412, which attempt to recover the digital signal and provide the digital signals to decoders 414. Decoders 414 provide decoded outputs to an MPEG transport stream (TS) interface 416, which provides a digital transport stream to a system that supports MPEG transport streams, such as MPEG system 422. In an example, MPEG TS interface 416 is a particular example of DTV I/O interface 108 of FIG. 1.

In general, DTV demodulator 106 integrates DVB-T and DVB-C digital demodulators into a single module for integration with tuner 104, MCU 114, and ATV demodulator on integrated circuit 100 for supporting terrestrial and cable standards. In some instances, DTV demodulator 106 may alternatively integrate DVB-S and/or DVB-S2 digital demodulators. QPSK/8PSK demodulator 406, DVB-TV demodulator 408, and equalizers 410 and 412 cooperate to provide a image rejection filter, long and short echo management, impulsive noise reduction, and fast scan functionality. The DVB-TV demodulator 408 further allows for demodulation of widely deployed DVB-S, DIRECTV™ (DSS) legacy standards, and next generation DVB-S2 satellite broadcast. Decoders 414 include a low-density parity check (LDPC) decoder, a Bose, Ray-Chaudhuri, and Hocquenghem (BCH) decoder, a Viterbi decoder, a Reed-Solomon (RS) decoder, and optionally other decoders. MCU 114 can reconfigure one or more functions of decoders 414 to provide desired decoding functions.

MPEG TS interface 416 is a programmable digital interface configurable by MCU 114 to provide a flexible range of output modes. MPEG TS interface 416 is fully compatible with all MPEG decoders or conditional access modules to support any compatible customer application.

In operation, MCU 114 controls timing of operations by DSP and synchronization circuit 404, QPSK/8PSK demodulator 406, DVB-TV demodulators 408, equalizers 410 and 412, decoders 414, and MPEG TS interface 416 to time digital switching events such that the spectrum of the resulting digital switching noise minimizes resulting spurious interference in the band of interest. Additionally, MCU 114 can manipulate system clock rates to adjust locations of clock-related spurs and their harmonics so as to avoid placing such spurs either directly in the signal band or at frequencies that may, through inter-modulation mechanisms, be indirectly translated into the signal passband.

Additionally, MCU 114 controls MPEG TS interface 416 to shape current pulses of the output transport stream. In one example, MCU 114 controls pulse shaping within the transport stream by re-clocking or re-sampling the transport stream at a clock frequency that results in the introduction of a spectral null at some RF target frequency of interest. In another instance, MCU 114 controls MPEG TS interface 416 to provide output timing staggered across a multi-bit parallel bus such that each bit transition takes place at a different time relative to a reference time, thereby reducing peak impulsive current consumption and reducing associated broadband RF interference. In a further example, MCU 114 can control MPEG TS interface 416 to provide a serial transport stream as opposed to the aforementioned parallel transport stream. In still another example, MCU 114 can control MPEG TS interface 416 to communicate the digital transport stream using differential signaling, in which for every output transition on a digital interface pin, there is a reverse transition on a close-by unused pin, providing some amount of cancellation of electrical and magnetic field components thereby reducing RF interference.

Figure 5:
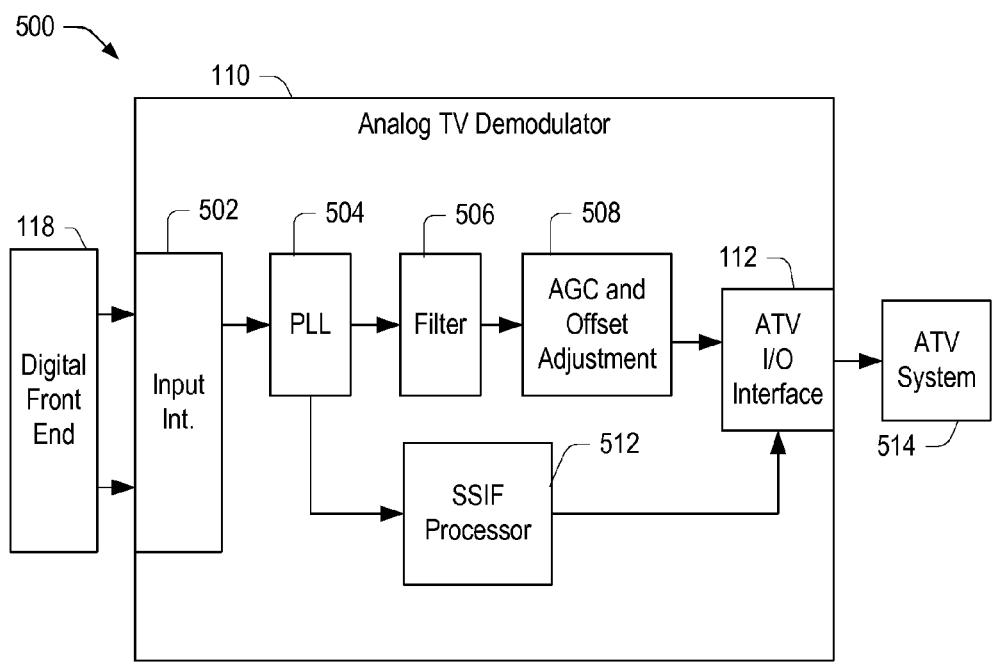
FIG. 5 is a block diagram of an embodiment of the analog television demodulator of FIG. 1.

FIG. 5 is a block diagram of an embodiment of the ATV demodulator 110 of FIG. 1. ATV demodulator 110 includes an input interface 502 connected to digital front-end circuit 118 for receiving in-phase and quadrature IF signals. Input interface 502 includes an output connected to an input of a phase-locked loop (PLL) circuit 504, which has a first output connected to an input of a filter 506 and a second output connected to an input of an inter-carrier SIF, a second ($2^{nd}$) SIF or SSIF processor 512. Filter 506 includes an output connected to an input of an automatic gain control (AGC) and offset adjustment circuit 508, which has an output connected to an input of an ATV input/output (I/O) interface 112. SSIF processor 512 includes an output connected to ATV I/O interface 112. ATV I/O interface 112 includes an output connected to an ATV system 514.

In an example, PLL circuit 504 receives the signal from digital front-end circuit 118 through input interface 502, compares the phase of the input signal with the phase of the signal derived from its output oscillator, and adjusts the frequency of its oscillator to keep the phases matched. PLL circuit 504 recovers the signal carrier from the input signal and provides a baseband video output signal to filter 506 and a phase-locked SIF output signal to SSIF processor 512. Filter 506 selects and shapes the spectrum of the video signal and AGC and offset adjustment 508 applies a gain and optionally an offset adjustment to the video signal to produce an adjusted video signal, which is provided to ATV I/O interface 112. SSIF processor 512 channelizes and optionally demodulates the SIF output signal to produce an output audio signal that is provided to ATV I/O interface 112. ATV I/O interface 112 provides output video and audio signals to ATV system 514.

MCU 114 can control PLL 504, filter 506, AGC and offset adjustment circuit 508, ATV I/O 510, and SSIF processor 512 to provide a complete terrestrial and cable hybrid receiver that can decode ATV signals (e.g., National Television Systems Committee (NTSC) signals, Phase Alternating Line (PAL) signals, and Sequential Color with Memory (SECAM) signals) and DTV signals (e.g., Advanced Television Systems Committee (ATSC) signals, quadrature amplitude modulation (QAM) signals, DVB-T signals, DVB-C signals, and Integrated Services Digital Broadcasting (ISDB) terrestrial and/or cable signals, Digital Terrestrial Multimedia Broadcasting (DTMB), or other DTV signals). The filter 506 is a configurable digital filter implementation, allowing solid-state configurability optimized for each of the various supported TV standards, replacing the prior art plurality of discrete SAW filters, thereby reducing the bill of materials. Further, LNA and tracking filters are provided by tuner 104. Additionally, ATV I/O 510 is programmable by MCU 114 to provide flexible output options, including CVBS, low-IF (LIF) or zero-IF (ZIF) to DTV demodulator 106, second sound IF (SSIF) or audio frequency (AF) outputs, and so on.

In general, integration of tuner 104, DTV demodulator 106, DTV I/O interface 108, ATV demodulator 110, ATV (analog/digital) I/O interface 112, and MCU 114 allows for enhanced RF reception, allowing for robust inter-circuit communications on-chip without having to communicate through, for example, serial pins. Further, MCU 114 can selectively adjust the timing of various operations to reduce spurious RF interference from digital components, enhancing analog performance. Additionally, MCU 114 can control various components to configure them for desired RF signal reception.

In conjunction with the integrated circuit 100 described above with respect to FIG. 1 and specific components described above with respect to FIGS. 2-5, an integrated circuit is disclosed that includes a tuner, a DTV demodulator, an ATV demodulator, and an MCU configured to provide digital and analog television receiver functionality. MCU controls operation of the tuner, DTV demodulator, and ATV demodulator and selectively controls clock signals and operational timing of various operations to suppress spurious RF interference. Further, by integrating MCU, control inputs to the integrated circuit are eliminated, reducing the pin count while allowing for more robust communication and control of various components by MCU. Additionally, by removing the inter-chip communications, some sources of RF interference are eliminated, thereby enhancing analog signal reception.

Although the present invention has been described with reference to preferred embodiments, workers skilled in the art will recognize that changes may be made in form and detail without departing from the spirit and scope of the invention.

What is claimed is:

1. An integrated circuit comprising:
    a tuner including an input for receiving a radio frequency (RF) signal including at least one of an analog television signal and digital television signal, and including a first output terminal and a second output terminal, the tuner to process the RF signal into an intermediate frequency (IF) signal including one of analog television content and digital television content, the tuner configured to selectively provide the IF signal to one of the first output terminal and the second output terminal;
    a digital television (DTV) demodulator including a DTV input coupled to the first output terminal of the tuner and including a DTV output terminal, the DTV demodulator configured to decode the IF signal and to provide a transport stream to the DTV output terminal;
    an analog television (ATV) demodulator including an ATV input coupled to the second output terminal of the tuner and including an ATV output terminal, the ATV demodulator configured to process the IF signal to recover a baseband video signal and an audio signal and to provide the baseband video and the audio signal to the ATV output terminal; and
    a controller coupled to the tuner, the DTV demodulator, and the ATV demodulator to configure the tuner and at least one of the DTV demodulator and the ATV demodulator for receiving television content in a selected television format, the controller configured to control clock rates and switching timing of the DTV demodulator and to control timing of the transport stream; and
    a host interface coupled to the controller and configurable to couple to a host system, the host interface to receive instructions from the host system that, when processed by the controller, cause the controller to reconfigure real-time signal-processing functions including at least one of a group consisting of a channel scanning algorithm and an automatic gain control timing function.

2. The integrated circuit of claim 1, wherein the selected television format comprises at least one of a digital video broadcasting (DVB)-Terrestrial format, a DVB-Cable format, a DVB-Satellite format, a Digital Terrestrial Multimedia Broadcasting (DTMB) format, an ISDB-T format, a quadrature amplitude modulation (QAM) format, an ATSC format, National Television Systems Committee (NTSC) format, Phase Alternating Line (PAL) format, and Sequential Color with Memory (SECAM) format.

3. The integrated circuit of claim 1, wherein the controller controls timing of operations of the DTV demodulator to reduce spectral noise in a frequency band of interest.

4. The integrated circuit of claim 1, wherein the controller disables the DTV demodulator and the transport stream when the selected television format comprises the analog television signal to reduce spurious RF interference.

5. The integrated circuit of claim 1, wherein the controller is configured to manipulate a clock rate to adjust locations of clock signal-related spurious RF interference such that the spurious RF interference falls outside of a frequency band of interest.

6. The integrated circuit of claim 1, further comprising:
a host interface coupled to the controller and configurable to couple to a host system;
wherein the controller is responsive to instructions from the host system; and
wherein the controller selectively translates the instructions into procedures for reconfiguration and operation of the tuner, the DTV demodulator, and the ATV demodulator.

7. The integrated circuit of claim 1, wherein the tuner includes a digital front-end; and
wherein the integrated circuit further comprising an ATV simulator circuit including an input coupled to the controller and an output coupled to an input of the digital front-end, the ATV simulator circuit configured to provide a simulated ATV signal to the digital front-end to provide a self-test of the digital front-end and the ATV demodulator.

8. The integrated circuit of claim 1, further comprising:
a DTV I/O interface coupled to the DTV output terminal for providing the transport stream to another device;
an ATV I/O interface coupled to the ATV output terminal for providing the baseband video and the audio signals to a different device in one of an analog format and a digital format; and
wherein the controller selectively controls timing of at least one of the DTV I/O interface and the ATV I/O interface to reduce noise spurs at a frequency of interest from RF interference associated with one of the transport stream and the baseband video and the audio signals.

9. An integrated circuit comprising:
an input connection for receiving a radio frequency (RF) signal including at least one of an analog television signal and a digital television signal;
a digital television (DTV) input/output (I/O) interface;
an analog television (ATV) I/O interface;
a tuner including an input coupled to the input connection and including a first output and a second output, the tuner configured to down-convert the RF signal to an intermediate frequency (IF) signal including one of analog television content and digital television content, the tuner configured to selectively provide the IF signal to one of the first output and the second output;
a digital television (DTV) demodulator including a DTV input coupled to the first output of the tuner and including a DTV output coupled to the DTV I/O interface, the DTV demodulator configured to decode the IF signal and to provide a transport stream to the DTV I/O interface;
an analog television (ATV) demodulator including an ATV input coupled to the second output of the tuner and including an ATV output coupled to the ATV I/O interface, the ATV demodulator configured to process the IF signal to recover a baseband video signal and an audio signal and to provide the baseband video signal and the audio signal to the ATV I/O interface;
a controller coupled to the tuner, the DTV demodulator, the ATV demodulator, the DTV I/O interface, and the ATV I/O interface to decode a selected channel from the RF signal and to provide television content from the selected channel to one of the DTV I/O interface and the ATV I/O interface in a selected output format; and
a host interface coupled to the controller and configurable to couple to a host system, the host interface to receive instructions from the host system that, when processed by the controller, cause the controller to reconfigure real-time signal-processing functions including at least one of a group consisting of a channel scanning algorithm, a signal-to-noise ratio (SNR) calculation and reporting function, an error recovery algorithm, and an automatic gain control timing function.

10. The integrated circuit of claim 9, wherein the controller manipulates one or more clock signals to reduce RF interference at a frequency of interest.

11. The integrated circuit of claim 9, wherein the controller controls timing of transmission of a transport stream through the DTV I/O interface to reduce spurious RF interference.

12. The integrated circuit of claim 9, wherein the controller controls the DTV I/O interface to shape output current pulses to reduce RF interference at a frequency of interest.

13. The integrated circuit of claim 9, wherein the controller disables the DTV demodulator and the transport stream, to reduce switching noise when receiving the analog television signal.

14. The integrated circuit of claim 9, further comprising a host interface for communicating information between the controller and a host system.

15. The integrated circuit of claim 9, wherein the DTV demodulator is configured to demodulate the digital television signal in one of a DVB-T format, a DVB-C format, a DVB-S format, a DTMB format, an ISDB-T format, and an ATSC format.

16. An integrated circuit comprising:
a digital television (DTV) demodulator including a DTV input and an DTV output, the DTV demodulator configured to decode a signal having an intermediate frequency to produce a digital television output signal;
an analog television (ATV) demodulator including an ATV input and an ATV output, the ATV demodulator to demodulate the signal having the intermediate frequency to produce a television output signal in one of a digital format and an analog format;
a tuner including a tuner input for receiving a radio frequency (RF) signal including at least one of an analog television signal and a digital television signal, the tuner including a first output terminal coupled to the DTV input and a second output terminal coupled to the ATV input, the tuner to convert the RF signal to the signal having the intermediate frequency;

a controller configured to control operation of the tuner, the DTV demodulator and the ATV demodulator to selectively provide the signal to one of the first output terminal and the second output terminal, the controller, when receiving analog television signals, to control the DTV demodulator to enter a low power state and to control the ATV demodulator to provide the television output signal as differential output signals; and a host interface coupled to the controller and configured to receive instructions from a host system that cause the controller to reconfigure signal-processing functions including at least one of a group consisting of a channel scanning algorithm and an error recovery algorithm.

17. The integrated circuit of claim 16, further comprising:
a DTV input/output interface including an input coupled to the DTV output;
an ATV input/output interface including an input coupled to the ATV output; and
wherein the controller controls operation of the digital input/output interface to control timing of output signals to reduce spurious RF interference at a frequency of interest.

18. The integrated circuit of claim 16, wherein the controller manipulates one or more clock signals to reduce clock-related noise spurs in the television output signal from the ATV demodulator.

19. The integrated circuit of claim 16, further comprising an ATV simulator circuit including an input coupled to the controller and an output coupled to a digital front-end circuit of the tuner, the ATV simulator circuit configured to provide a simulated ATV signal to the digital front-end circuit to provide a self-test of the digital front-end circuit and the ATV demodulator.

20. The integrated circuit of claim 16, wherein the controller controls the tuner to provide the signal having an intermediate frequency to the second output terminal and disables the DTV demodulator.

21. The integrated circuit of claim 16, further comprising:
a DTV input/output interface including an input coupled to the DTV output; and
wherein the controller controls operation of the DTV input/output interface to provide differential output signals to reduce spurious RF interference.

22. The integrated circuit of claim 16, further comprising:
an ATV input/output interface including an input coupled to the ATV output; and
wherein the controller controls operation of the ATV input/output interface to reduce in-band noise.

23. The integrated circuit of claim 16, further comprising:
a DTV input/output interface including an input coupled to the DTV output;
wherein the controller controls operation of the DTV input/output interface to shape pulses within output signals to reduce spurious RF interference at a frequency of interest.

24. The integrated circuit of claim 23, wherein the controller selectively controls the operation of the DTV input/output interface to shape pulses by applying at least one of a re-clocking operation to re-clock the transport stream to a clock frequency that results in the introduction of a spectral null at a frequency of interest, a staggered output timing operation to adjust output timing of parallel bits of the transport stream, and a differential signaling operation to use differential output signals to reduce radio frequency interference.

* * * * *